(12) United States Patent
Lim et al.

(10) Patent No.: US 10,998,362 B2
(45) Date of Patent: May 4, 2021

(54) FAN-OUT SENSOR PACKAGE

(71) Applicant: SAMSUNG ELECTRONICS CO., LTD., Suwon-si (KR)

(72) Inventors: Jae Hyun Lim, Suwon-Si (KR); Yoon Seok Seo, Suwon-Si (KR); Kyung Moon Jung, Suwon-Si (KR); Eun Jin Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/915,274

(22) Filed: Jun. 29, 2020

(65) Prior Publication Data

US 2020/0328241 A1 Oct. 15, 2020

Related U.S. Application Data

(63) Continuation of application No. 16/132,757, filed on Sep. 17, 2018, now Pat. No. 10,700,110.

(30) Foreign Application Priority Data

Jan. 19, 2018 (KR) ........................ 10-2018-0007333

(51) Int. Cl.
   *H01L 27/146* (2006.01)
   *H01L 31/0203* (2014.01)
   *H01L 31/0232* (2014.01)

(52) U.S. Cl.
   CPC .. *H01L 27/14618* (2013.01); *H01L 27/14625* (2013.01); *H01L 27/14632* (2013.01);
   (Continued)

(58) Field of Classification Search
   CPC ............. H01L 23/3121; H01L 23/3157; H01L 25/162; H01L 27/14618; H01L 27/1462;
   (Continued)

(56) References Cited

U.S. PATENT DOCUMENTS 6,566,745 B1    5/2003  Beyne et al.
6,707,125 B2    3/2004  Harazono
(Continued)

FOREIGN PATENT DOCUMENTS

JP      2002-198502 A    7/2002
KR   10-2008-0063223 A    7/2008
(Continued)

OTHER PUBLICATIONS

Communication dated Jul. 29, 2019, issued by the Taiwan Patent Office in counterpart Taiwan Application No. 107132310.
(Continued)

*Primary Examiner* — Stephen W Smoot
(74) *Attorney, Agent, or Firm* — Sughrue Mion, PLLC

(57) ABSTRACT

A fan-out sensor package includes: a substrate in which a through-hole is formed and portions of a wiring layer are exposed from an insulating layer; an image sensor having an active surface having a sensing region disposed below the through-hole of the substrate and connection pads disposed in the vicinity of the sensing region; an optical member disposed on the active surface of the image sensor; a dam member disposed in the vicinity of the sensing region; and an encapsulant encapsulating the substrate and the image sensor, wherein the third wiring layer and the connection pads are electrically connected to each other by connection members.

10 Claims, 12 Drawing Sheets

(52) U.S. Cl.
CPC .... *H01L 27/14636* (2013.01); *H01L 31/0203* (2013.01); *H01L 31/02325* (2013.01)

(58) Field of Classification Search
CPC ......... H01L 27/14625; H01L 27/14632; H01L 27/14636; H01L 31/0203; H01L 31/0224; H01L 31/02325
See application file for complete search history.

(56) References Cited

U.S. PATENT DOCUMENTS

| | | |
|---|---|---|
| 2002/0088987 A1 | 7/2002 | Sakurai |
| 2004/0041247 A1 | 3/2004 | Kinsman |
| 2008/0017941 A1 | 1/2008 | Yang et al. |
| 2008/0083964 A1 | 4/2008 | Fujimoto et al. |
| 2008/0157312 A1 | 7/2008 | Yang et al. |
| 2008/0191297 A1 | 8/2008 | Yang et al. |
| 2011/0037136 A1 | 2/2011 | Chow et al. |
| 2012/0043635 A1 | 2/2012 | Yang |
| 2013/0026591 A1 | 1/2013 | Iwafuchi |
| 2013/0056844 A1 | 3/2013 | Oganesian |
| 2013/0285185 A1 | 10/2013 | Park et al. |
| 2014/0184809 A1 | 7/2014 | Luan |
| 2015/0270239 A1 | 9/2015 | Yang et al. |

FOREIGN PATENT DOCUMENTS

| | | |
|---|---|---|
| KR | 10-2008-0075450 A | 8/2008 |
| KR | 10-2013-0120122 A | 11/2013 |
| KR | 101453158 B1 | 10/2014 |
| KR | 10-2016-0091509 A | 8/2016 |
| KR | 10-2017-0093277 A | 8/2017 |

OTHER PUBLICATIONS

Korean Office Action dated Jan. 21, 2019 issued in Korean Patent Application No. 10-2018-0007333.

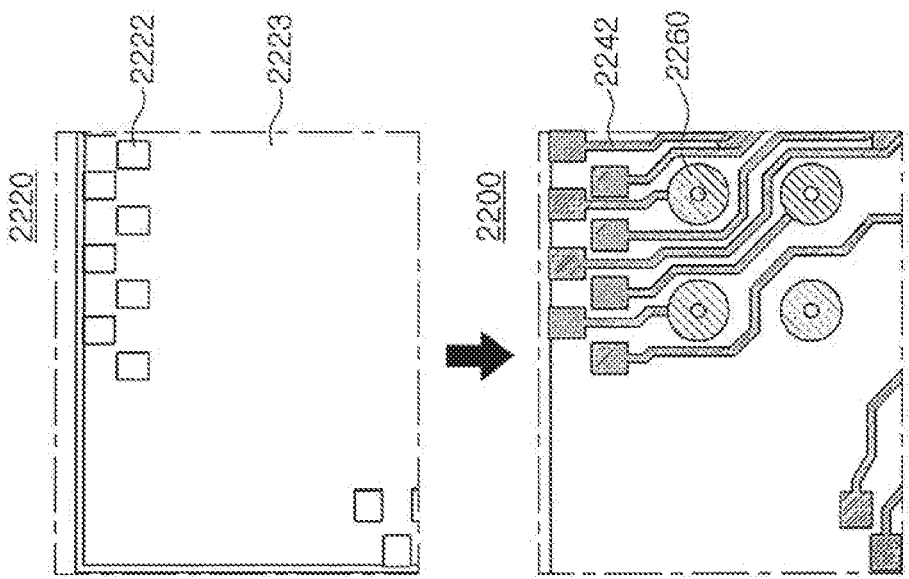
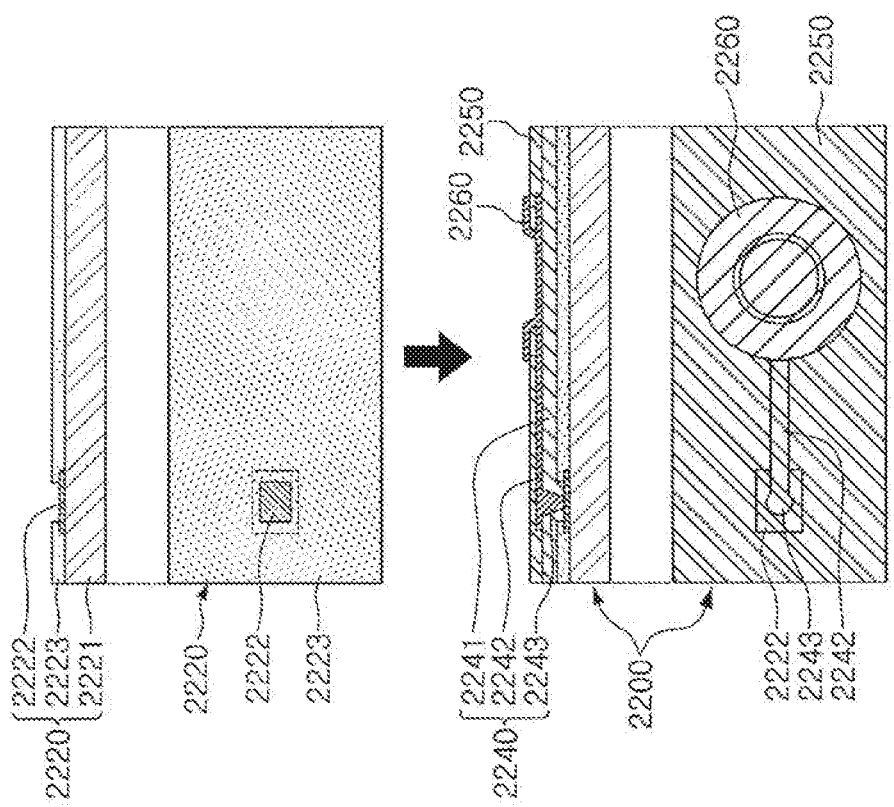
FIG. 3B
FIG. 3A

FAN-OUT SENSOR PACKAGE

CROSS-REFERENCE TO RELATED APPLICATION(S)

This application is a Continuation Application of U.S. application Ser. No. 16/132,757, filed on Sep. 17, 2018, which claims the benefit of priority to Korean Patent Application No. 10-2018-0007333 filed on Jan. 19, 2018, in the Korean Intellectual Property Office, the disclosures of which are incorporated herein by reference in their entireties.

TECHNICAL FIELD

The present disclosure relates to a fan-out sensor package.

BACKGROUND

Due to the development of semiconductor technology in accordance with an explosive increase in the use of various electronic devices, precise and complicated electronic devices have appeared. Particularly, an optical field has been widely applied to various sensor components using imaging technology according to the related art.

In addition, in order to implement thinning of an optical fingerprint sensor mounted in a portable device, a manufacturing method using an electronic component embedded substrate has recently been used. However, a complicated process is required in order to externally expose an optical member bonded to an upper portion of an image sensor, and there is a risk that photosensitivity will be decreased due to damage of the optical member caused by permeation of foreign materials.

Accordingly, there is a need to develop a structure capable of simplifying a manufacturing process, increasing a path of light incident to the image sensor, and decreasing stress applied to the optical member.

SUMMARY

An aspect of the present disclosure may provide a fan-out sensor package in which a sensing area may be increased by increasing a path of light incident to an image sensor and reliability of an optical member may be improved by decreasing stress applied to the optical member at the time of thermal impact.

According to an aspect of the present disclosure, a fan-out sensor package may include; a substrate in which a through-hole is formed and portions of a wiring layer are exposed from an insulating layer; an image sensor having an active surface having a sensing region disposed below the through-hole of the substrate and connection pads disposed in the vicinity of the sensing region; an optical member disposed on the active surface of the image sensor; a dam member disposed in the vicinity of the sensing region; and an encapsulant encapsulating the substrate and the image sensor, wherein the wiring layer and the connection pads are electrically connected to each other by connection members.

Side surfaces of the optical member may be disposed to be spaced apart from inner walls of the through-hole.

Side surfaces of the optical member may be exposed to external air.

The fan-out sensor package may further include a passive element disposed in the vicinity of the image sensor and encapsulated in the encapsulant, portions thereof being externally exposed.

The fan-out sensor package may further include an electrical connection structure encapsulated in the encapsulant, portions thereof being externally exposed.

The substrate may include a first substrate in which a first through-hole is formed and a second substrate in which a second through-hole is formed, the image sensor being disposed in the second through-hole.

The first substrate and the second substrate may be electrically connected to each other by a connection member formed of a conductive material, and a sealing member may be disposed between the first and second substrates.

Connection pads of the second substrate may be disposed to be exposed externally from the encapsulant.

The fan-out sensor package may further include an electrical connection structure disposed in the vicinity of the image sensor and protruding from the encapsulant.

The fan-out sensor package may further include a metal bar disposed in the vicinity of the image sensor and disposed so that one end thereof is exposed from the encapsulant.

The encapsulant may encapsulate the image sensor, and a lower surface of the image sensor may be externally exposed.

A plurality of wiring layers may be formed in the substrate.

According to another aspect of the present disclosure, a fan-out sensor package may include: a substrate in which a through-hole is formed and portions of a wiring layer are exposed from an insulating layer; an image sensor having an active surface having a sensing region disposed below the through-hole of the substrate and connection pads disposed in the vicinity of the sensing region; an optical member disposed on the active surface of the image sensor; and an encapsulant encapsulating the substrate and the image sensor, wherein the wiring layer and the connection pads are electrically connected to each other by connection members.

The encapsulant may be filled in spaces between side surfaces of the optical member and inner walls of the through-hole.

The fan-out sensor package may further include a transparent material filled in spaces between side surfaces of the optical member and inner walls of the through-hole.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Figure 1:
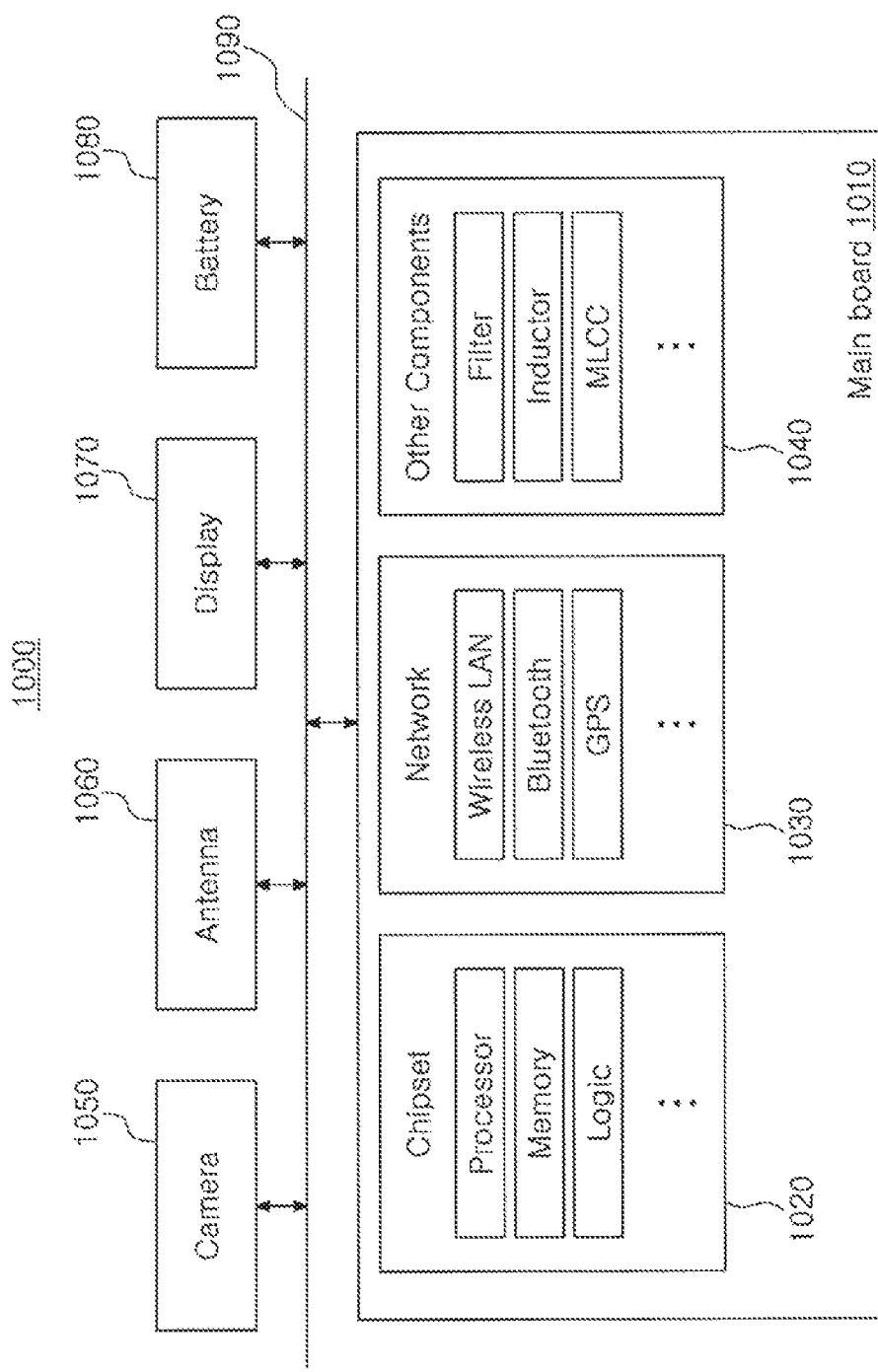
FIG. 1 is a schematic block diagram illustrating an example of an electronic device system.

Hereinafter, exemplary embodiments of the present disclosure will now be described in detail with reference to the accompanying drawings. In the accompanying drawings, shapes, sizes, and the like, of components may be exaggerated or stylized for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in context.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), highspeed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (CPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
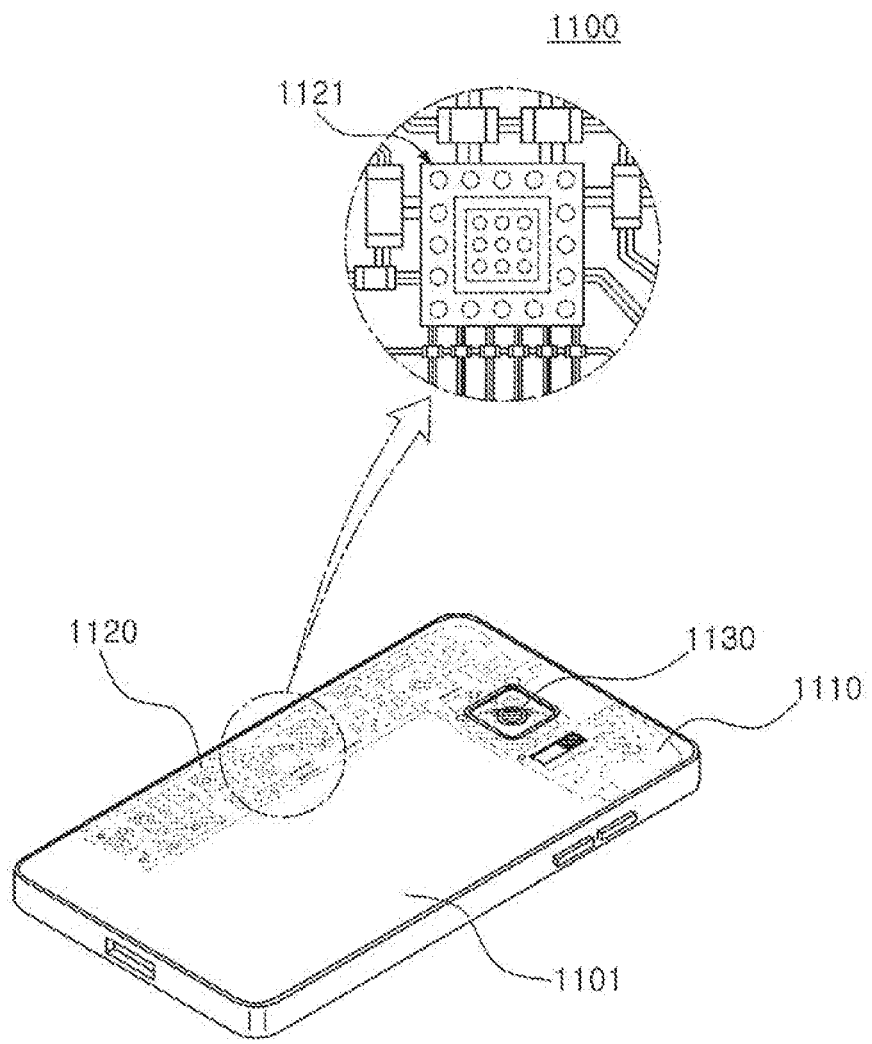
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a body 1101 of the smartphone 1100, and various electronic components 1120 such as a semiconductor package 1121 may be physically or electrically connected to the mainboard 1110. In addition, other components that may or may not be physically or electrically connected to the mainboard 1110, such as the camera module 1130, may be accommodated in the body 1101. The camera module 1130 may include an image sensor package, and a fan-out sensor package according to the present disclosure may be used in the smartphone. Meanwhile, the electronic device in which the fan-out sensor package according to the present disclosure is used is not limited to the smartphone 1100. That is, the fan-out sensor package according to the present disclosure may also be used in other electronic devices.

Semiconductor Package

A fan-out sensor package according to the present disclosure may be manufactured using technology of a semiconductor package. Generally, numerous fine electrical circuits are integrated in a semiconductor. However, the semiconductor may not serve as a finished semiconductor product in itself, and may be damaged due to external physical or chemical impacts. Therefore, the semiconductor itself may not be used, but may be packaged and used in an electronic device, or the like, in a packaged state.

Here, semiconductor packaging is required due to the existence of a difference in a circuit width between the semiconductor and a mainboard of the electronic device in terms of electrical connections. In detail, a size of connection pads of the semiconductor and an interval between the connection pads of the semiconductor are very fine, but a size of component mounting pads of the mainboard and an interval between the component mounting pads of the mainboard are significantly larger than those of the semiconductor. Therefore, it may be difficult to directly mount the semiconductor on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIGS. 3A and 3B are schematic cross-sectional views illustrating states of a fan-in semiconductor package before and after being packaged.

Figure 4:
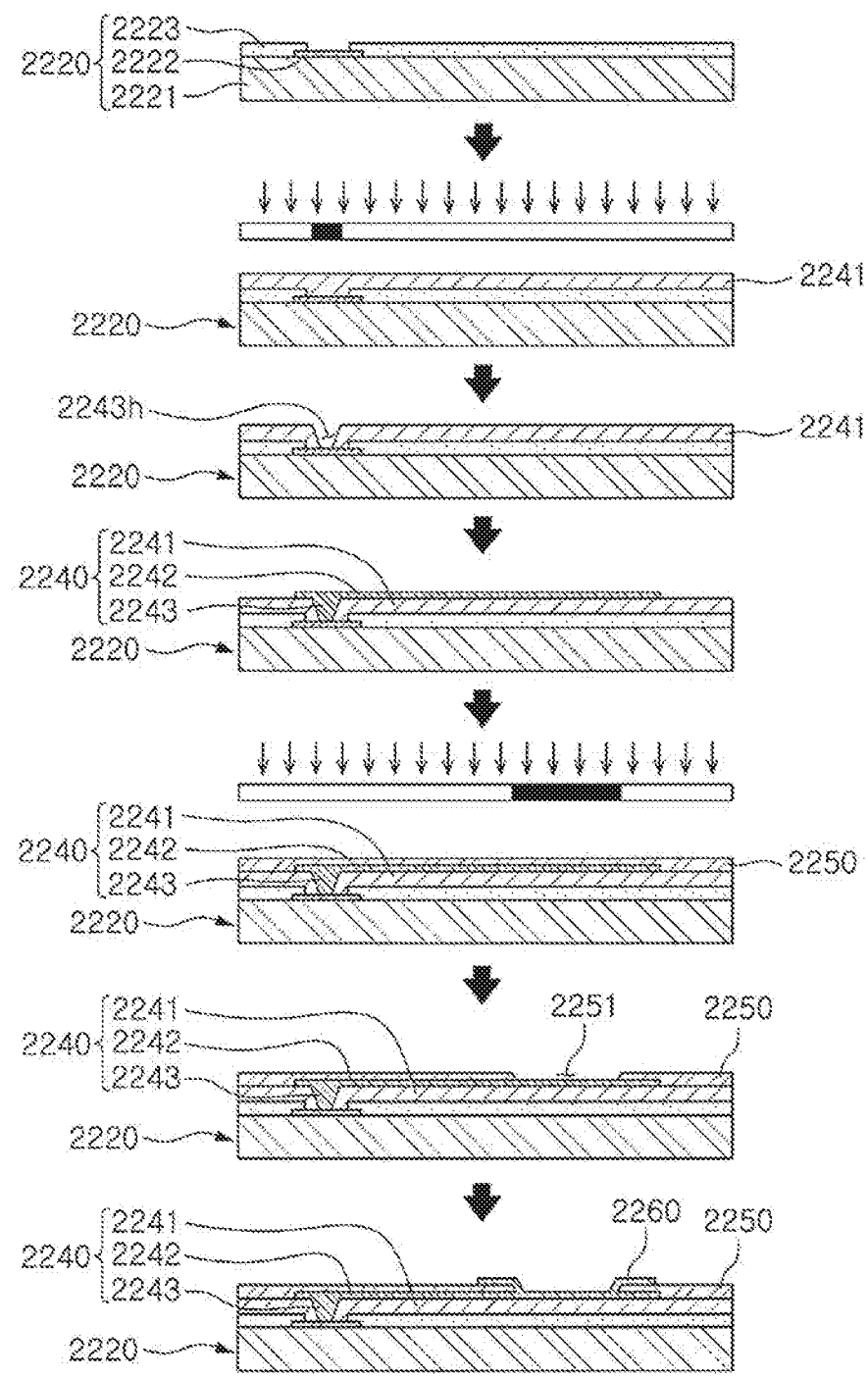
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor are disposed inside the semiconductor, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor in the fan-in semiconductor package, the fan-in semiconductor package has significant spatial limitations. Therefore, it is difficult to apply this structure to a semiconductor having a large number of I/O terminals or a semiconductor having a compact size. In addition, due to the disadvantage described above, the fan-in semiconductor package may not be directly mounted and used on the mainboard of the electronic device. The reason is that even in the case in which a size of the I/O terminals of the semiconductor and an interval between the I/O terminals of the semiconductor are increased by a redistribution process, the size of the I/O terminals of the semiconductor and the interval between the I/O terminals of the semiconductor may not be sufficient to directly mount the fan-in semiconductor package on the mainboard of the electronic device.

Figure 5:
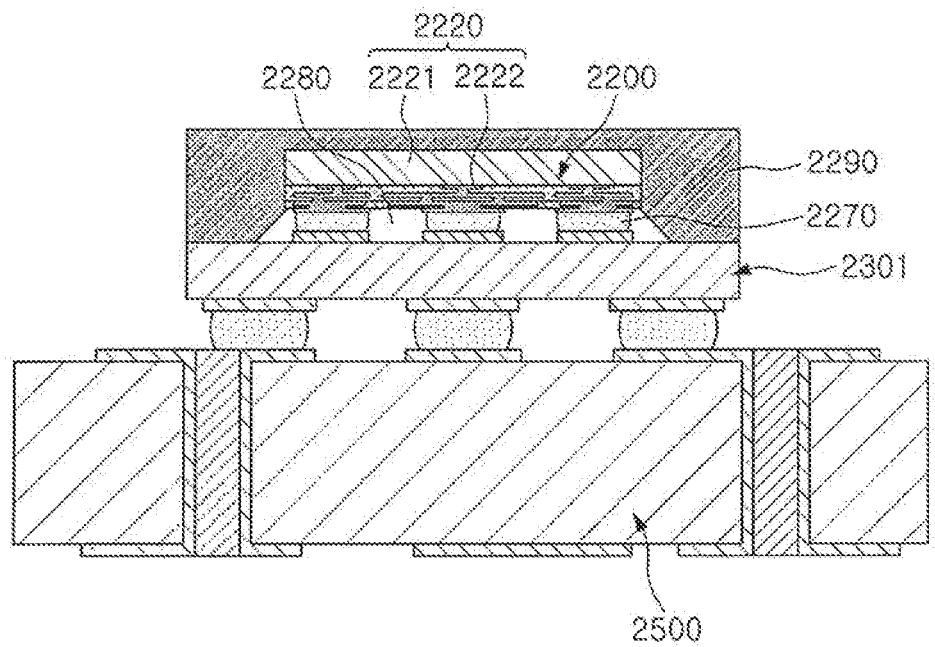
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
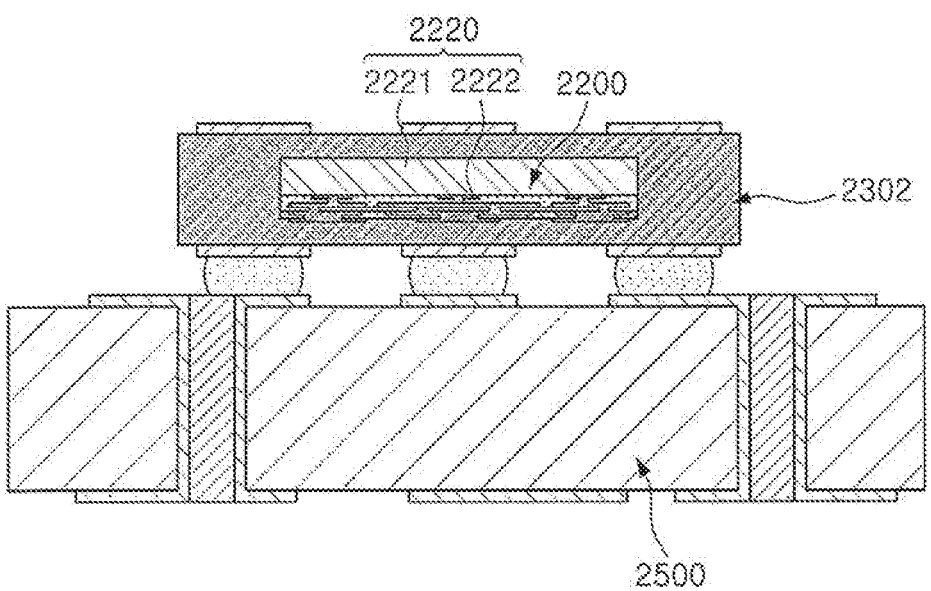
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the EGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
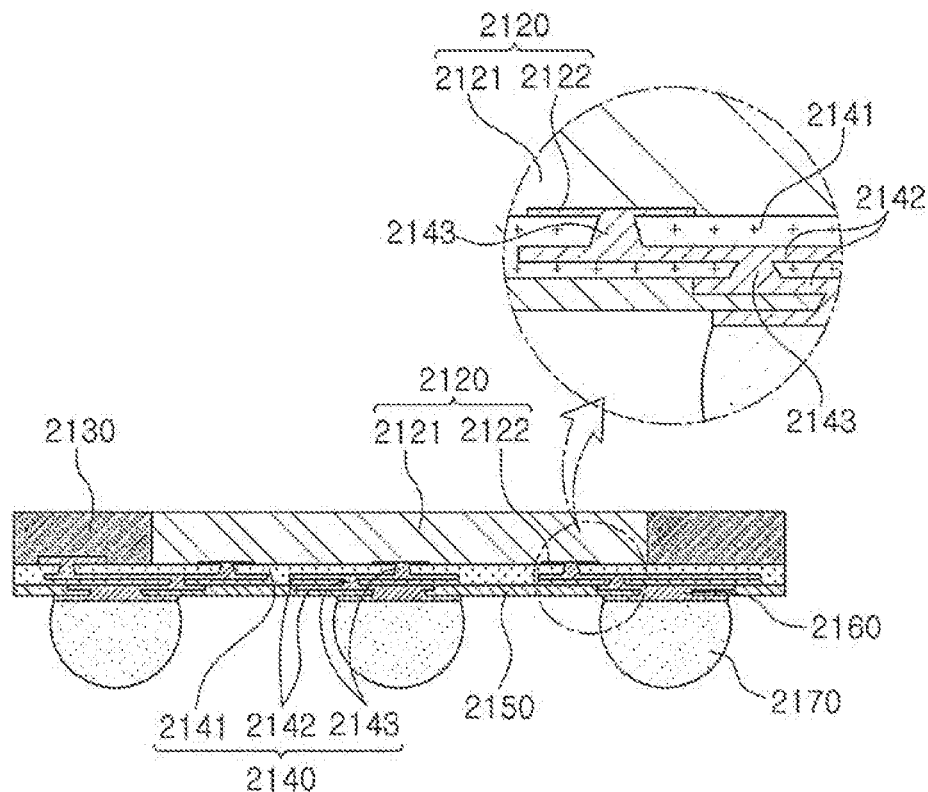
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2150, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor are redistributed and disposed outwardly of the semiconductor through the connection member formed on the semiconductor. As described above, in the fan-in semiconductor package, all I/O terminals of the semiconductor need to be disposed inside the semiconductor. Therefore, when a size of the semiconductor is decreased, a size and a pitch of balls need to be decreased, such that a standardized ball layout may not be used in the fan-in semiconductor package. On the other hand, the fan-out semiconductor package has the form in which the I/O terminals of the semiconductor are redistributed and disposed outwardly of the semiconductor through the connection member formed on the semiconductor as described above. Therefore, even in the case in which a size of the semiconductor is decreased, a standardized ball layout may be used in the fan-out semiconductor package as it is, such that the fan-out semiconductor package may be mounted on the mainboard of the electronic device without using a separate BGA substrate, as described below.

Figure 8:
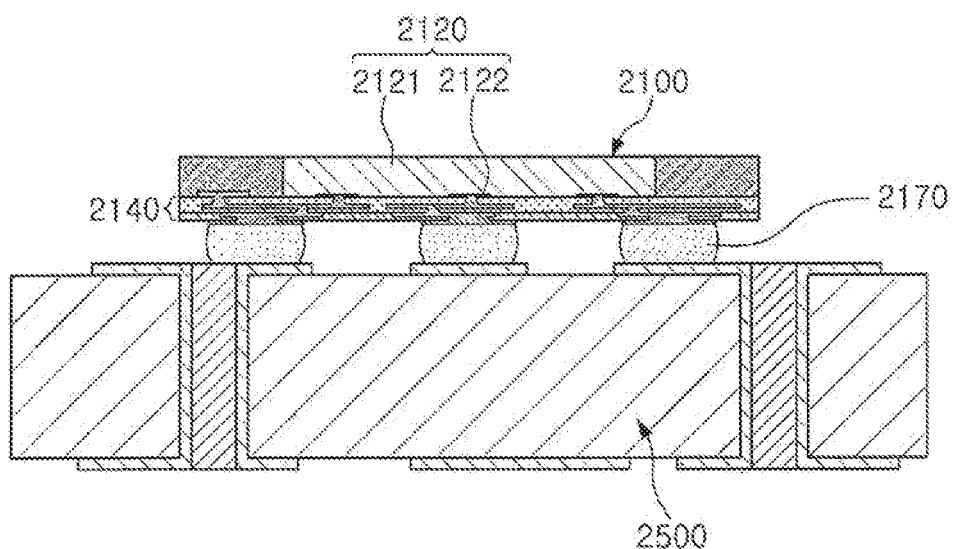
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor on the mainboard of the electronic device, or the like, as described above, and protecting the semiconductor from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out sensor package according to the present disclosure may be manufactured using the fan-out semiconductor package technology described above. A fan-out sensor package according to the present disclosure will hereinafter be described with reference to the drawings.

Figure 9:
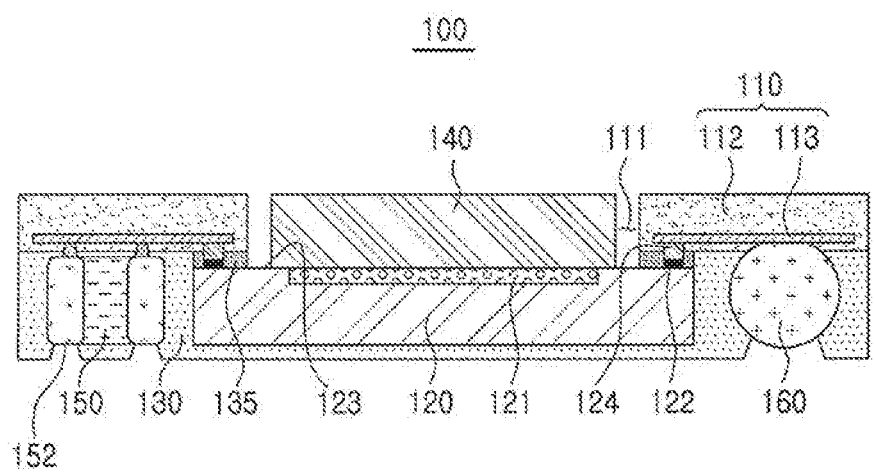
FIG. 9 is a schematic cross-sectional view illustrating a fan-out sensor package according to a first exemplary embodiment in the present disclosure.

FIG. 9 is a schematic cross-sectional view illustrating a fan-out sensor package according to a first exemplary embodiment in the present disclosure.

Referring to FIG. 9, a fan-out sensor package 100 according to a first exemplary embodiment in the present disclosure may include a substrate 110, an image sensor 120, an encapsulant 130, dam members 135, an optical member 140, a passive element 150, and electrical connection structures 160 as an example.

Meanwhile, the fan-out sensor package 100 according to the first exemplary embodiment may be used as a fingerprint recognizing module used in an electronic device as an example. However, the fan-out sensor package 100 is not limited thereto, but may be used for various purposes.

A through-hole 111 may be formed in, for example, a central portion of the substrate 110. As an example, the substrate 110 may include an insulating layer 112 and a wiring layer 113 formed in the insulating layer 112. As an example, the wiring layer 113 may be a single layer. Meanwhile, the through-hole 111 may have a shape corresponding to that of the optical member 140, and may have a size greater than that of the optical member 140 so that the optical member 140 may be disposed in the through-hole 111.

In addition, portions of the wiring layer 113 may be exposed from the insulating layer 112. That is, portions of the wiring layer 113 may be exposed from the insulating layer 112 in order to electrically connect the substrate 110 and the image sensor 120.

The image sensor 120 may have an active surface 123 having a sensing region 121 disposed below the through-hole 111 of the substrate 110 and connection pads 122 disposed in the vicinity of the sensing region. As an example, the image sensor 120 may be a complementary metal oxide semiconductor (CMOS) image sensor (CIS), but is not limited thereto. The image sensor 120 may be formed on the basis of an active wafer. In this case, a base material of a body of the image sensor may be silicon (Si), germanium (Ge), gallium arsenide (GaAs), or the like. Various circuits may be formed on the body. The connection pads 122 may electrically connect the image sensor 120 to other components. A material of each of the connection pads 122 may be a conductive material such as aluminum (Al), or the like.

The term "vicinity" as used herein refers to an area immediately neighboring a particular defined feature or structure without overlapping another defined feature or structure, the general size of which is determined based on the design parameters of the structure. For example, the "vicinity" of a structure or feature may be an area having a width of about 10%, about 15%, about 20%, or any number between these percentages, of the characteristic dimension of the structure or feature immediately outside the area of the structure or feature. Thus, in some embodiments, the vicinity of a structure may be an area equal to, double, quadruple, eight times, nine times, sixteen times, or any other multiplier between any two of these numbers, the area of that structure. Thus, if a connection pad has a size of 10 μm×10 μm, the vicinity may be an area surrounding the connection pad having a size of about 15 μm×15 μm, 20 μm×20 μm, 25 μm×25 μm, 30 μm×30 μm or 40 μm×40 μm. On the other hand, the "vicinity" of a sensor element having a size of 500 μm×500 μm may be, for example, a 50 μm, 60 Am, 75 μm or 100 μm wide strip surrounding the sensor element. It must be noted that the extent to which the "vicinity" extends is determined by design parameters such as, for example, distance between defined structures or features. For example, if two neighboring connection pads, having a size of 10 μm×10 μm each, are separated by an edge-to-edge distance 20 μm, the "vicinity" may be a strip of 2 μm width around all the edges of each of the connection pads. On the other hand, for a sensor element having a size of 500 μm×500 μm, if the sensing region is a central portion of if the sensor element with a size of 400 μm×400 μm, the "vicinity" may be a strip having a width of about 50 μm, about 60 μm, about 75 μm or about 100 μm surrounding the sensing region.

Meanwhile, the wiring layer 113 and the connection pads 122 may be electrically connected to each other by connection members 124. As an example, each of the connection members 124 may be formed of a bump.

The encapsulant 130 may encapsulate the substrate 110 and the image sensor 120. As an example, the encapsulant 130 may serve to protect the image sensor 120. An encapsulation form of the encapsulant 130 is not particularly limited, but may be a form in which the encapsulant 130 surrounds at least portions of the image sensor 120. For example, the encapsulant 130 may cover at least portions of the substrate 110 and the image sensor 120.

Materials of the encapsulant 130 are not particularly limited. For example, an insulating material may be used as the materials of the encapsulant 130. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, Ajinomoto Build-up Film (ABF), FR-4, Bismaleimide Triazine (BT), a photoimagable dielectric (PID) resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The dam members 135 may be disposed in the vicinity of the sensing region 121. Therefore, the dam members 135 may serve to prevent the encapsulant 130 from being introduced into the sensing region 121. As an example, the dam members 135 may be formed of a material different from that of the encapsulant 130. That is, an insulating material different from an insulating material used as a material of the encapsulant 130 may be used as a material of the dam member 135. As an example, the insulating material used as the material of the dam member 135 may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like, similar to that of the encapsulant 130. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

The optical member 140 may be disposed on an upper surface of the image sensor 120. As an example, the optical member 140 may be disposed on the sensing region 121 of the image sensor 120. In addition, side surfaces of the optical member 140 may be disposed to be spaced apart from inner walls of the through-hole 111, and may be exposed to external air.

In addition, since the side surfaces of the optical member 140 are disposed to be spaced apart from the inner walls of the through-hole 111, an incident path of light may further be secured, and a light recognizing region by the image sensor 120 may thus be increased.

Meanwhile, since the optical member 140 is disposed to be spaced apart from the inner walls of the through-hole 111, stress applied to the optical member 140 at the time of thermal impact may be decreased to improve reliability of the optical member 140.

As an example, the optical member 140 may be formed of at least one selected from the group consisting of sapphire, glass, reinforced glass, plastic, polycarbonates (PCs), and polyamides (PIs). In addition, the optical member 140 may be, for example, a lens of which optical characteristics such as a refractive index, a magnetic permeability, and the like, are designed within a desired range. The optical member 140 may be formed on the active surface of the image sensor 120 on a wafer and be integrated with the image sensor 120.

The passive element 150 may be disposed in the vicinity of the image sensor 120. Meanwhile, the passive element 150 may be installed on a lower surface of the substrate 110, and may be encapsulated in the encapsulant 130 so that portions thereof are externally exposed. That is, the passive element 150 may be electrically connected to a mainboard (not illustrated), and may include connection portions 152 provided on one surface thereof in order to electrically connect the passive element 150 and the mainboard to each other. In addition, the connection portions 152 of the passive element 150 may be exposed externally from the encapsulant 130.

Each of the electrical connection structures 160 may be formed of a conductive material, for example, a solder, or the like. However, this is only an example, and a material of each of the electrical connection structures 160 is not particularly limited thereto. Each of the electrical connection structures 160 may be a land, a ball, a pin, a bump, or the like. The electrical connection structures 160 may be formed as a multilayer or single layer structure. When the electrical connection structures 160 are formed as a multilayer structure, the electrical connection structures 160 may include a copper (Cu) pillar and a solder. When the electrical connection structures 160 are formed as a single layer structure, the electrical connection structures 160 may include a tin-silver solder or copper (Cu). However, this is only an example, and the electrical connection structures 160 are not limited thereto. The number, an interval, a disposition form, and the like, of electrical connection structures 160 are not particularly limited, but may be sufficiently modified depending on design particulars by those skilled in the art. For example, the electrical connection structures 160 may be provided in an amount of several tens to several thousands according to the number of connection pads 122 of the image sensor 120, or may be provided in an amount of several tens to several thousand or more or several tens to several thousand or less. At least one of the electrical connection structures 160 may be disposed in a fan-out region. The fan-out region refers to a region except for the region in which the image sensor 120 is disposed. That is, the fan-out sensor package 100 according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

As described above, the side surfaces of the optical member 140 may be disposed to be spaced apart from the inner walls of the through-hole 111, and the incident path of the light may thus be further secured. Therefore, the light recognizing region by the image sensor 120 may be increased.

Further, since the optical member 140 is disposed to be spaced apart from the inner walls of the through-hole 111, the stress applied to the optical member 140 at the time of the thermal impact may be decreased to improve the reliability of the optical member 140.

A method of manufacturing a fan-out sensor package according to a first exemplary embodiment in the present disclosure will hereinafter be described with reference to the drawings.

FIGS. 10 through 14 are views illustrating processes of a method of manufacturing a fan-out sensor package according to a first exemplary embodiment in the present disclosure.

Figure 10:
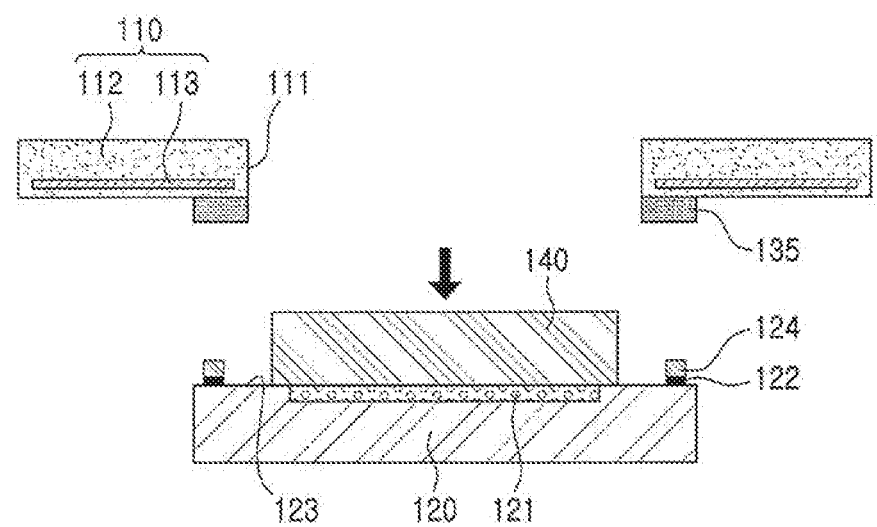
FIGS. 10 through 14 are views illustrating processes of a method of manufacturing a fan-out sensor package according to a first exemplary embodiment in the present disclosure.

First, as illustrated in FIG. 10, the through-hole 111 may be formed in the central portion of the substrate 110, and the dam members 135 may be formed on to be disposed on the lower surface of the substrate 110, that is, in the vicinity of the through-hole 111. A material of the dam member 135 may be an insulating material. As an example, the insulating material used as the material of the dam member 135 may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a photoimagable dielectric (PID) resin, or the like, similar to that of the encapsulant 130. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Meanwhile, the optical member 140 may be formed on the sensing region 121 of the image sensor 120, and the connection members 124 for electrical connection between the connection pads 122 of the image sensor 120 and the substrate 110 may be formed on the connection pads 122 of the image sensor 120.

As an example, the optical member 140 may be formed of at least one selected from the group consisting of sapphire, glass, reinforced glass, plastic, polycarbonates (PCs), and polyamides (PIs).

Figure 11:
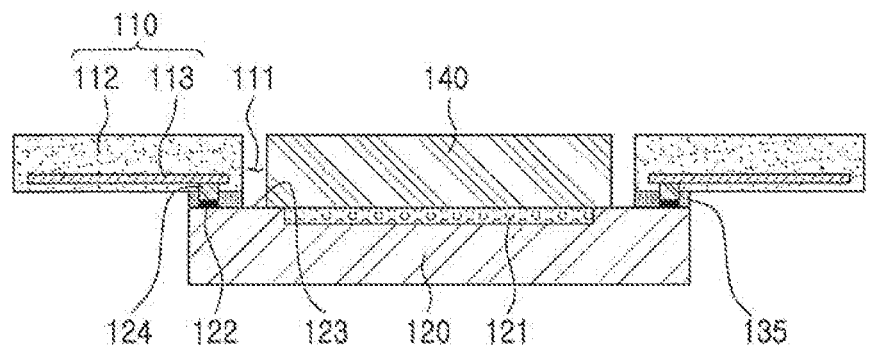

Then, as illustrated in FIG. 11, the substrate 110 and the image sensor 120 may be connected to each other. In this case, the optical member 140 may be disposed in the through-hole 111 of the substrate 110. In addition, the side surfaces of the optical member 140 may be disposed to be spaced apart from the inner walls of the through-hole 111, and may be exposed to the external air.

In addition, the connection pads 122 of the image sensor 120 may be electrically connected to the wiring layer 113 of the substrate 110 through the connection members 124.

Figure 12:
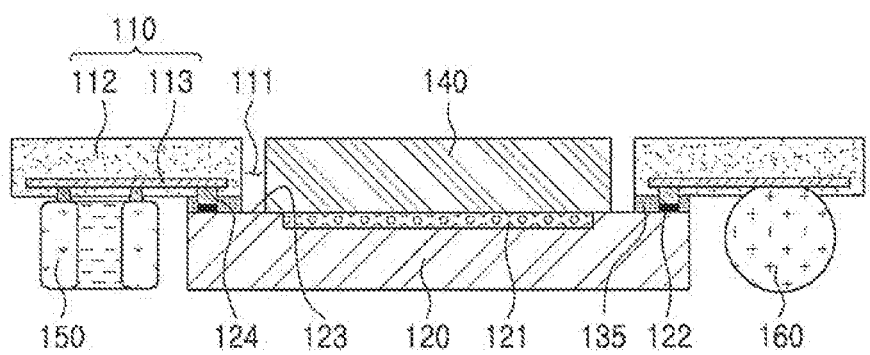

Then, as illustrated in FIG. 12, the passive element 150 may be installed on the lower surface of the substrate 110, and the electrical connection structures 160 may be formed on the lower surface of the substrate 110. The passive element 150 and the electrical connection structures 160 may be disposed in the vicinity of the image sensor 120.

In addition, the passive element 150 and the electrical connection structures 160 may also be connected to the wiring layer 113 of the substrate 110.

Figure 13:
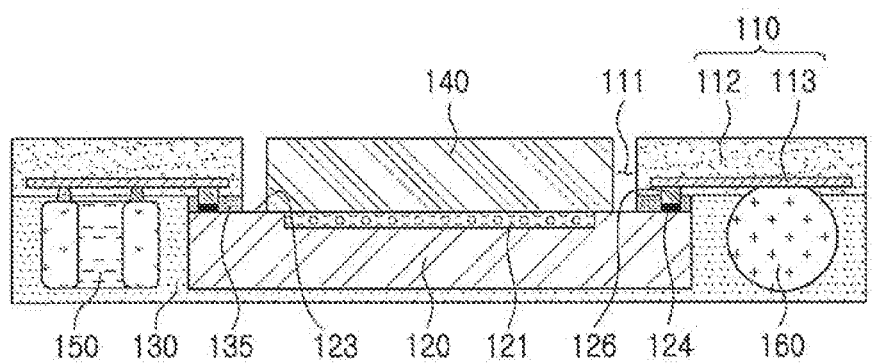

Then, as illustrated in FIG. 13, the image sensor 120, the passive element 150, and the electrical connection structures 160 may be encapsulated in the encapsulant 130. As an example, the encapsulant 130 may be formed of a material different from that of the dam member 135. A material of the encapsulant 130 may be an insulating material. As an example, the insulating material may be a thermosetting resin such as an epoxy resin, a thermoplastic resin such as a polyimide resin, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Figure 14:
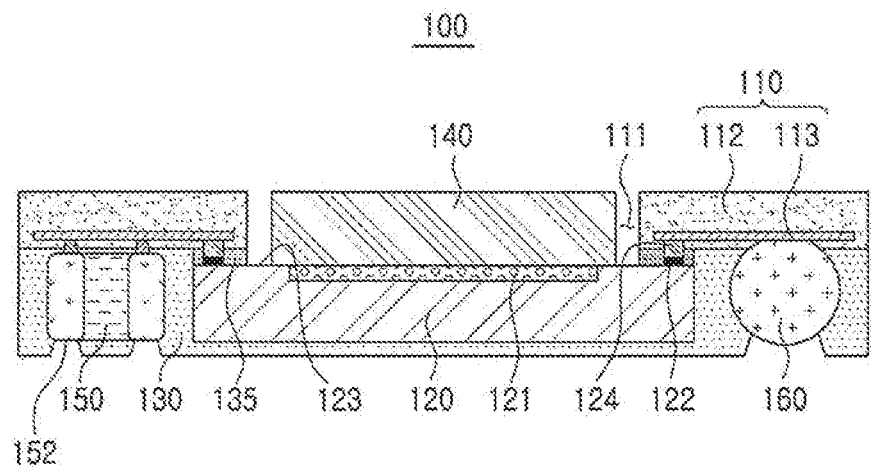

Then, as illustrated in FIG. 14, portions of the passive element 150, that is, the connection portions 152, and portions of the electrical connection structures 160 may be exposed by removing portions of the encapsulant 130.

As described above, a manufacturing yield of the fan-out sensor package may be improved by omitting a complicated process such as a wire bonding process and directly installing the image sensor 120 on the substrate 110.

Further, since the side surfaces of the optical member 140 may be disposed to be exposed to the external air, the incident path of the light may further be secured. Therefore, the light recognizing region by the image sensor 120 may be increased.

Further, since the optical member 140 is disposed to be spaced apart from the inner walls of the through-hole 111, the stress applied to the optical member 140 at the time of the thermal impact may be decreased to improve the reliability of the optical member 140.

Fan-out sensor packages according to other exemplary embodiments in the present disclosure will hereinafter be described with reference to the drawings.

Figure 15:
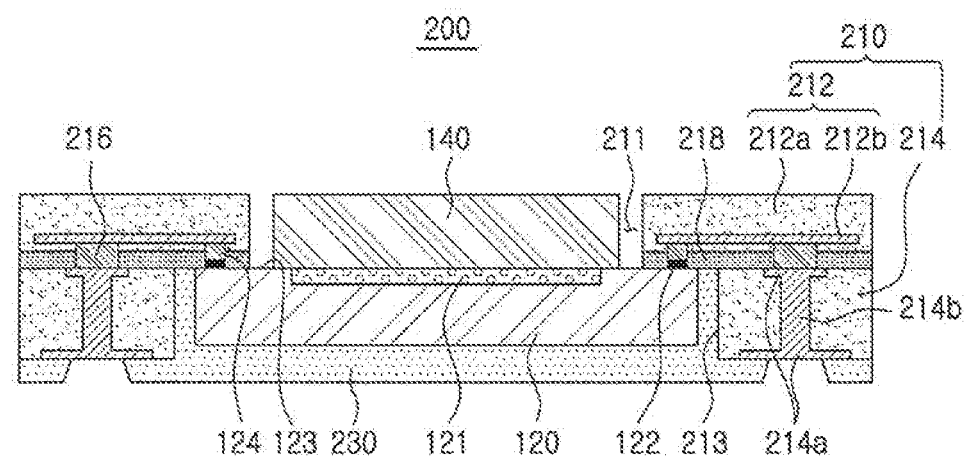
FIG. 15 is a schematic cross-sectional view illustrating a fan-out sensor package according to a second exemplary embodiment in the present disclosure.

FIG. 15 is a schematic cross-sectional view illustrating a fan-out sensor package according to a second exemplary embodiment in the present disclosure.

Referring to FIG. 15, a fan-out sensor package 200 according to a second exemplary embodiment in the present disclosure may include a substrate 210, an image sensor 120, an encapsulant 230, and an optical member 140 as an example.

Meanwhile, since the image sensor 120 and the optical member 140 correspond to the components described above, a detailed description therefor is omitted.

The substrate 210 may include a first substrate 212 in which a first through-hole 211 is formed and a second substrate 214 in which a second through-hole 213 is formed. The image sensor 120 may be disposed in the second through-hole 213.

As an example, the first through-hole 211 may be formed in a central portion of the first substrate 212. As an example, the first substrate 212 may include a first insulating layer 212a and a first wiring layer 212b formed in the first insulating layer 212a. As an example, the first wiring layer 212b may be a single layer.

Meanwhile, the first through-hole 211 may have a shape corresponding to that of the optical member 140, and may have a size greater than that of the optical member 140 so that the optical member 140 may be disposed in the first through-hole 211.

The second substrate 214 may be disposed below the first substrate 212. In addition, the second through-hole 213 may be disposed below the first through-hole 211, and may have a shape corresponding to that of the image sensor 120. Meanwhile, connection pads 214a may be provided on an upper surface and a lower surface of the second substrate 214, and vias 214b for connecting the connection pads 214a to each other may be provided in the second substrate 214.

In addition, the first and second substrates 212 and 214 may be electrically connected to each other by connection members 216, and a sealing member 218 may be disposed between the first and second substrates 212 and 214.

The encapsulant 230 may encapsulate the image sensor 120 and the second substrate 214. That is, the encapsulant 230 may be filled in the second through-hole 213 of the second substrate 214. As an example, materials of the encapsulant 230 are not particularly limited. For example, an insulating material may be used as the materials of the encapsulant 230. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Meanwhile, the connection pads 214a of the second substrate 214 may be exposed externally from the encapsulant 230 and be connected to a mainboard (not illustrated) through solders, or the like.

As described above, the substrate 210 may include the first substrate 212 and the second substrate 214 to improve a wiring density.

In addition, side surfaces of the optical member 140 may be disposed to be spaced apart from the first through-hole 211, and an incident path of light may thus be further secured. Therefore, a light recognizing region by the image sensor 120 may be increased.

Further, since the side surfaces of the optical member 140 are disposed to be spaced apart from the first through-hole 211, stress applied to the optical member 140 at the time of thermal impact may be decreased to improve reliability of the optical member 140.

Figure 16:
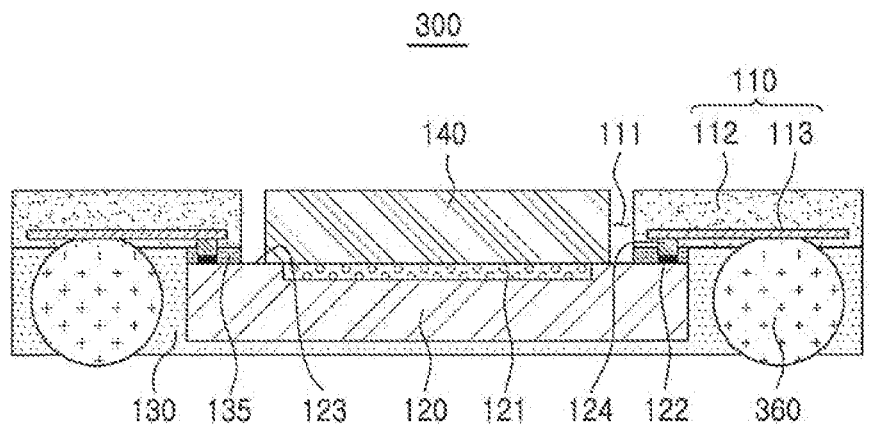
FIG. 16 is a schematic cross-sectional view illustrating a fan-out sensor package according to a third exemplary embodiment in the present disclosure.

FIG. 16 is a schematic cross-sectional view illustrating a fan-out sensor package according to a third exemplary embodiment in the present disclosure.

Referring to FIG. 16, a fan-out sensor package 300 according to a third exemplary embodiment in the present disclosure may include a substrate 110, an image sensor 120, an encapsulant 130, an optical member 140, and electrical connection structures 360 as an example.

Meanwhile, since the substrate 110, the image sensor 120, the encapsulant 130, and the optical member 140 correspond to the components described above, a detailed description therefor is omitted.

The electrical connection structures 360 may be formed on a lower surface of the substrate 110, and may have a thickness greater than that of the image sensor 120. Further, as an example, a lower end portion of each of the electrical connection structures 360 may protrude from the encapsulant 130. As an example, each of the electrical connection structures 360 may be formed of a conductive material, for example, a solder, or the like. However, this is only an example, and a material of each of the electrical connection structures 360 is not particularly limited thereto. Each of the electrical connection structures 360 may be a land, a ball, or the like. The electrical connection structures 360 may be formed as a multilayer or single layer structure. When the electrical connection structures 360 are formed as a multilayer structure, the electrical connection structures 360 may include a copper (Cu) pillar and a solder. When the electrical connection structures 360 are formed as a single layer structure, the electrical connection structures 360 may include a tin-silver solder or copper (Cu). However, this is only an example, and the electrical connection structures 360 are not limited thereto. The number, an interval, a disposition form, and the like, of electrical connection structures 360 are not particularly limited, but may be sufficiently modified depending on design particulars by those skilled in the art. In addition, the electrical connection structures 360 may be connected to a mainboard (not illustrated), such that the substrate 110 and the main board may be electrically connected to each other.

As described above, the electrical connection structures 360 may protrude from the encapsulant 130, and a separate process of removing the encapsulant 130 in order to expose the electrical connection structures 360 may thus be omitted.

Therefore, a manufacturing yield of the fan-out senor package may be improved.

Further, side surfaces of the optical member 140 may be disposed to be spaced apart from inner walls of the through-hole 111, and an incident path of a light may thus be further secured. Therefore, a light recognizing region by the image sensor 120 may be increased.

Further, since the optical member 140 is disposed to be spaced apart from the inner walls of the through-hole 111, stress applied to the optical member 140 at the time of thermal impact may be decreased to improve reliability of the optical member 140.

Figure 17:
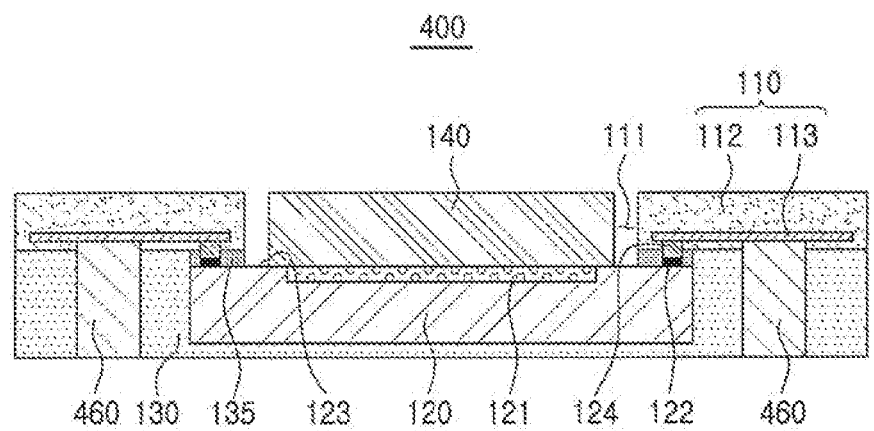
FIG. 17 is a schematic cross-sectional view illustrating a fan-out sensor package according to a fourth exemplary embodiment in the present disclosure.

FIG. 17 is a schematic cross-sectional view illustrating a fan-out sensor package according to a fourth exemplary embodiment in the present disclosure.

Referring to FIG. 17, a fan-out sensor package 400 according to a fourth exemplary embodiment in the present disclosure may include a substrate 110, an image sensor 120, an encapsulant 130, an optical member 140, and metal bars 460 as an example.

Meanwhile, since the substrate 110, the image sensor 120, the encapsulant 130, and the optical member 140 correspond to the components described above, a detailed description therefor is omitted.

The metal bars 460 may be disposed in the vicinity of the image sensor 120, and may be disposed so that one end thereof is exposed from the encapsulant 130. As an example, the other end of the metal bar 460 may be connected to a wiring layer 113 of the substrate 110, and one end thereof may be exposed externally from the encapsulant 130 as described above.

The metal bars 460 may be components for electrically connecting a mainboard (not illustrated) and the substrate 110 to each other, and when the metal bars 460 are formed, electrical conductivity may be improved.

Figure 18:
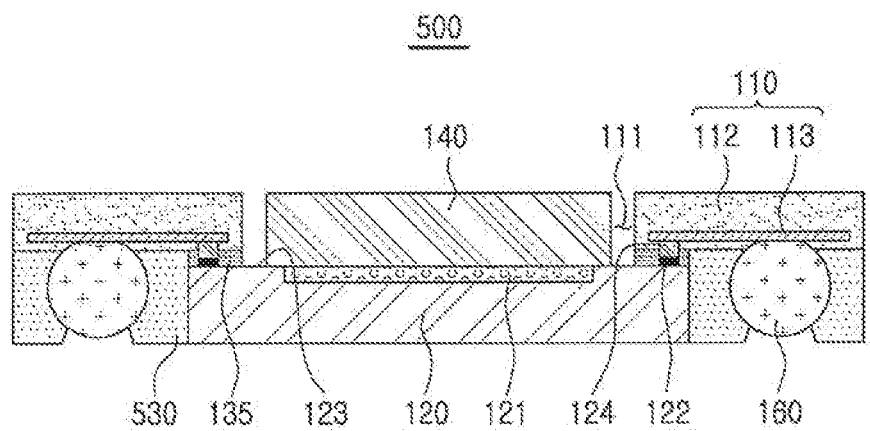
FIG. 18 is a schematic cross-sectional view illustrating a fan-out sensor package according to a fifth exemplary embodiment in the present disclosure.

FIG. 18 is a schematic cross-sectional view illustrating a fan-out sensor package according to a fifth exemplary embodiment in the present disclosure.

Referring to FIG. 18, a fan-out sensor package 500 according to a fifth exemplary embodiment in the present disclosure may include a substrate 110, an image sensor 120, an encapsulant 530, an optical member 140, and electrical connection structures 160 as an example.

Meanwhile, since the substrate 110, the image sensor 120, the optical member 140, and the electrical connection structures 160 correspond to the components described above, a detailed description therefor is omitted.

The encapsulant 530 may encapsulate the image sensor 120 and the substrate 110, and may have a thickness at which a lower surface of the image sensor 120 is externally exposed.

In addition, materials of the encapsulant 530 are not particularly limited. For example, an insulating material may be used as the materials of the encapsulant 530. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

As described above, when the thickness of the encapsulant 530 is decreased so that the lower surface of the image sensor 120 is externally exposed, an entire thickness of the fan-out sensor package 500 may be decreased, such that thinness of the fan-out sensor package may be implemented.

Figure 19:
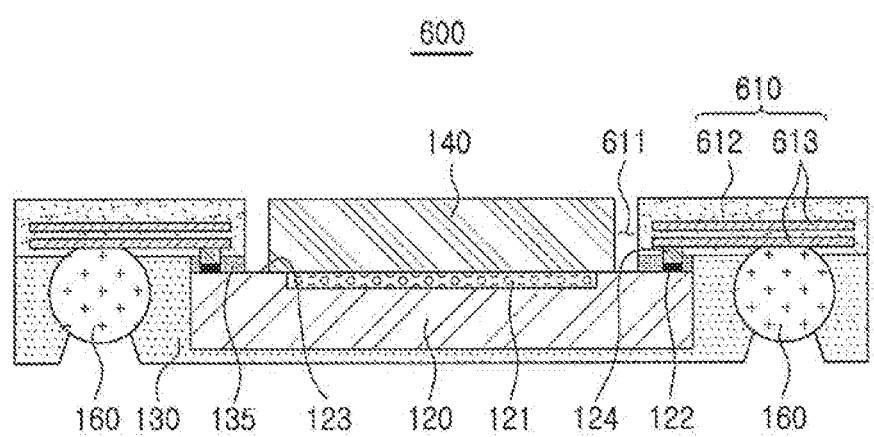
FIG. 19 is a schematic cross-sectional view illustrating a fan-out sensor package according to a sixth exemplary embodiment in the present disclosure.

FIG. 19 is a schematic cross-sectional view illustrating a fan-out sensor package according to a sixth exemplary embodiment in the present disclosure.

Referring to FIG. 19, a fan-out sensor package 600 according to a sixth exemplary embodiment in the present disclosure may include a substrate 610, an image sensor 120, an encapsulant 130, an optical member 140, and electrical connection structures 160 as an example.

Meanwhile, since the image sensor 120, the encapsulant 130, the optical member 140, and the electrical connection structures 160 correspond to the components described above, a detailed description therefor is omitted.

A through-hole 611 may be formed in a central portion of the substrate 610. As an example, the substrate 610 may include an insulating layer 612 and wiring layers 613 formed in the insulating layer 612. As an example, the wiring layers 613 may be a plurality of layers. Meanwhile, the through-hole 611 may have a shape corresponding to that of the optical member 140, and may have a size greater than that of the optical member 140 so that the optical member 140 may be disposed in the through-hole 611.

As described above, the wiring layers 613 may be formed as the plurality of layers, and a degree of freedom of a design of the substrate 610 may thus be improved.

Figure 20:
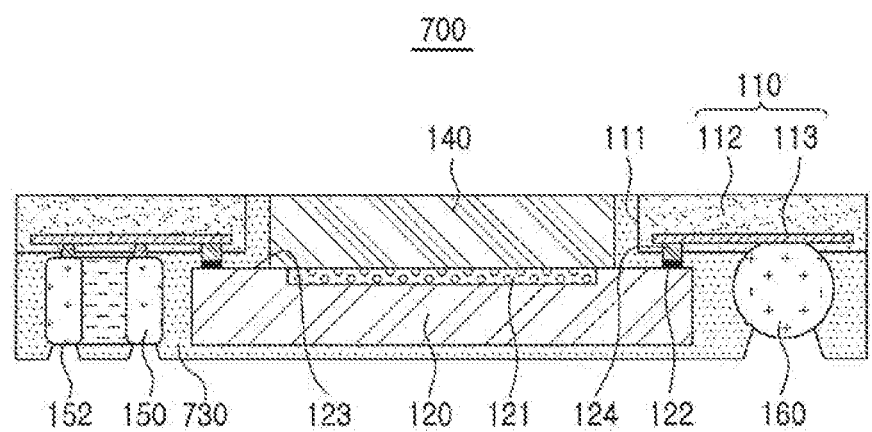
FIG. 20 is a schematic cross-sectional view illustrating a fan-out sensor package according to a seventh exemplary embodiment in the present disclosure.

FIG. 20 is a schematic cross-sectional view illustrating a fan-out sensor package according to a seventh exemplary embodiment in the present disclosure.

Referring to FIG. 20, a fan-out sensor package 700 according to a seventh exemplary embodiment in the present disclosure may include a substrate 110, an image sensor 120, an encapsulant 730, an optical member 140, and electrical connection structures 160 as an example.

Meanwhile, since the substrate 110, the image sensor 120, the optical member 140, and the electrical connection structures 160 correspond to the components described above, a detailed description therefor is omitted.

The encapsulant 730 may encapsulate the image sensor 120 and the substrate 110. In addition, the encapsulant 730 may also be filled in spaces formed by side surfaces of the optical member 140 and inner walls of the through-hole 111.

Meanwhile, materials of the encapsulant 730 are not particularly limited. For example, an insulating material may be used as the materials of the encapsulant 730. In this case, the insulating material may be a thermosetting resin such as an epoxy resin, a thermoplastic resin such as polyimide, a resin having a reinforcing material such as an inorganic filler impregnated in the thermosetting resin and the thermoplastic resin, for example, ABF, FR-4, BT, a PID resin, or the like. In addition, any known molding material such as an EMC, or the like, may also be used. Alternatively, a resin in which a thermosetting resin or a thermoplastic resin is impregnated together with an inorganic filler in a core material such as a glass fiber (or a glass cloth or a glass fabric) may also be used as the insulating material.

Therefore, rigidity of the fan-out sensor package 700 may be increased.

Figure 21:
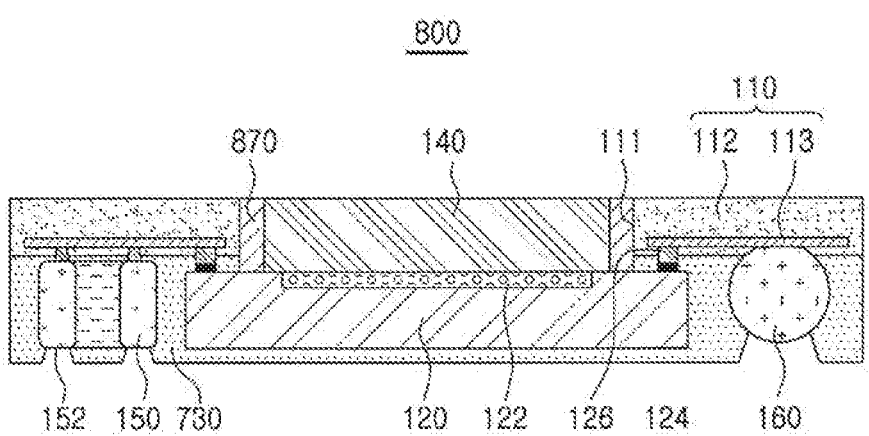
FIG. 21 is a schematic cross-sectional view illustrating a fan-out sensor package according to an eighth exemplary embodiment in the present disclosure.

FIG. 21 is a schematic cross-sectional view illustrating a fan-out sensor package according to an eighth exemplary embodiment in the present disclosure.

Referring to FIG. 21, a fan-out sensor package 800 according to an eighth exemplary embodiment in the present disclosure may include a substrate 110, an image sensor 120, an encapsulant 130, an optical member 140, a passive element 150, electrical connection structures 160, and a transparent material 870 as an example.

Meanwhile, since the substrate 110, the image sensor 120, the encapsulant 130, the optical member 140, the passive element 150, and the electrical connection structures 160 correspond to the components described above, a detailed description therefor is omitted.

The transparent material 870 may be filled in spaces between side surfaces of the optical member 140 and inner walls of the through-hole 111. Therefore, introduction of foreign materials into the image sensor 120 may be prevented, and an incident path of light may be secured.

As set forth above, according to an exemplary embodiment in the present disclosure, a sensing area may be increased by increasing a path of light incident to an image sensor, and reliability of an optical member may be improved by decreasing stress applied to the optical member at the time of thermal impact.

While exemplary embodiments have been shown and described above, it will be apparent to those skilled in the art that modifications and variations could be made without departing from the scope of the present invention as defined by the appended claims.

What is claimed is:

1. A fan-out sensor package comprising:
 a first substrate in which a first through-hole is formed and portions of a first wiring layer are exposed from a first insulating layer;
 an image sensor having an active surface having a sensing region disposed below the first through-hole of the first substrate and connection pads disposed in the vicinity of the sensing region;
 an optical member disposed on the active surface of the image sensor;
 a second substrate in which a second through-hole is formed, wherein the image sensor is inserted into and disposed in the second through-hole, and the second through-hole is disposed below the first through-hole; and
 an encapsulant encapsulating the image sensor and the second substrate,
 wherein the second substrate comprises a second insulating layer disposed to surround the image sensor, connection pads electrically connected to the first wiring layer and disposed on upper and lower surfaces of the second insulating layer, and a via connecting the connection pads.

2. The fan-out sensor package of claim 1, wherein an area of an upper surface of the image sensor is 400 µm to 500 µm×400 µm to 500 µm.

3. The fan-out sensor package of claim 1, wherein side surfaces of the optical member are spaced apart from an inner wall of the first through-hole.

4. The fan-out sensor package of claim 1, wherein side surfaces of the optical member are exposed to external air.

5. The fan-out sensor package of claim 1, wherein the first wiring layer and the connection pads are electrically connected to each other by a connection member formed of a conductive material, and a sealing member is disposed between the first and second substrates.

6. The fan-out sensor package of claim 1, wherein connection pads of the second substrate are disposed to be exposed externally from the encapsulant.

7. A fan-out sensor package comprising:
 a first substrate in which a first through-hole is formed and portions of a first wiring layer are exposed from a first insulating layer;
 an image sensor having an active surface having a sensing region disposed below the first through-hole of the first substrate and connection pads disposed in the vicinity of the sensing region;
 an optical member disposed on the active surface of the image sensor;
 a second substrate in which a second through-hole is formed, wherein the image sensor is inserted into and disposed in the second through-hole, and the second through-hole is disposed below the first through-hole; and
 an encapsulant encapsulating the image sensor and the second substrate,
 wherein the second substrate comprises a second insulating layer disposed to surround the image sensor, connection pads electrically connected to the first wiring layer and disposed on upper and lower surfaces of the second insulating layer, and a via connecting the connection pads, and
 the fan-out sensor package further comprises a transparent material filled in spaces between side surfaces of the optical member and inner walls of the first through-hole.

8. The fan-out sensor package of claim 7, wherein a sealing member is disposed between the first and second substrates.

9. A fan-out sensor package comprising:
a substrate in which a through-hole is formed and portions of a wiring layer are exposed from an insulating layer;
an image sensor having an active surface having a sensing region disposed below the through-hole of the substrate and connection pads disposed in the vicinity of the sensing region;
an optical member disposed on the active surface of the image sensor;
a dam member disposed in the vicinity of the sensing region;
an encapsulant encapsulating the image sensor; and
a connection member disposed to surround the image sensor and having connection pads on upper and lower surfaces of the connection member,
wherein one side of the connection pads has a distance of 10 μm to 40 μm.

10. The fan-out sensor package of claim 9, having a rectangular shape in a longitudinal section of each of the connection pads.

* * * * *